United States Patent

Yang

[11] Patent Number: 5,886,936
[45] Date of Patent: Mar. 23, 1999

[54] MEMORY CELL DATA LINE EQUALIZATION CONTROLLING CIRCUIT FOR SEMICONDUCTOR MEMORY DEVICE

[75] Inventor: Dong Jun Yang, Choongcheongbuk-Do, Rep. of Korea

[73] Assignee: LG Semicon Co., Ltd., Cheongju, Rep. of Korea

[21] Appl. No.: 900,334

[22] Filed: Jul. 25, 1997

[30] Foreign Application Priority Data

Jul. 26, 1996 [KR] Rep. of Korea ................. 96/30587

[51] Int. Cl.⁶ ........................................... G11C 7/00
[52] U.S. Cl. .................................. 3265/203; 365/194
[58] Field of Search ................................ 365/203, 189, 365/233, 233.5, 194, 207

[56] References Cited

U.S. PATENT DOCUMENTS 4,807,190  2/1989  Ishii et al. ........................ 365/189
5,268,874  12/1993  Yamauchi ........................ 365/233.5
5,740,115  4/1998  Ishibashi et al. ................. 365/203

Primary Examiner—David Nelms
Assistant Examiner—Thong Le
Attorney, Agent, or Firm—Fleshner & Kim

[57] ABSTRACT

A memory cell data equalization control circuit is provided for sensing data stored in a memory cell. The memory cell data equalization control circuit outputs the sensed data through a bit line and an input/output line in an input/output stage of a semiconductor memory device. The circuit includes a feedback unit for generating a plurality of feedback signals in accordance with a signal output from a main amplifier coupled to the input/output line and an equalizer for equalizing the input/output line in accordance with a first feedback signal. The circuit self-equalizes the data input/output line using the feedback signals generated according to the output from the main amplifier to enhance the data input/output speed. The circuit further controls the coupling of the bit line and the data line to reduce electric power consumption. Further, the circuit prevents instability in an applied system caused by glitching of an address signal.

20 Claims, 8 Drawing Sheets

FIG. 2A BACKGROUND ART  RAS
FIG. 2B BACKGROUND ART  CAS
FIG. 2C BACKGROUND ART  ADD
FIG. 2D BACKGROUND ART  ATD
FIG. 2E BACKGROUND ART  EQC
FIG. 2F BACKGROUND ART  YS
FIG. 2G BACKGROUND ART  I/O
FIG. 2H BACKGROUND ART  MAC
FIG. 2I BACKGROUND ART  DOUT

MEMORY CELL DATA LINE EQUALIZATION CONTROLLING CIRCUIT FOR SEMICONDUCTOR MEMORY DEVICE

BACKGROUND OF THE INVENTION

1. Field of the Invention

The present invention relates to equalizing a data line of a semiconductor memory device, and more particularly, to a memory cell data line equalization control circuit that self-equalizes the data input/output lines using a feedback signal output.

2. Background of the Related Art

As shown in FIG. 1, a first related art data input/output control circuit of a semiconductor memory device includes a sense amplifier 12 for sensing and amplifying to a first predetermined level a data being reciprocated to and from a memory cell 11 via bit lines B/L. A switch unit 13 selectively couples the bit lines B/L to an input/output lines I/O in accordance with a switch signal YS. A main amplifier 16 amplifies a signal received through the input/output lines I/O in accordance with a main amplifier control signal MAC. A pair of equalizers 14A, 14B are for coupling to and equalizing the input/output lines I/O in accordance with an equalization control signal EQC. A precharge unit 15 precharges the input/output lines I/O to the level of a supply potential Vcc in accordance with a precharge control signal PCS. A data latch unit 17 latches the output from the main amplifier 16, and a data output buffer 18 is for interfacing the latched data to an external device (not shown).

In the related art data input/output control circuit of the semiconductor memory device, a word line W/L is enabled by a row address strobe (RAS) type signal (not shown) to store data in the memory cell 11 or to read previously stored data from the memory cell. The resulting data value is sensed in the sense amplifier 12 via the bit lines B/L.

A column address strobe (CAS) signal (not shown) applied to a semiconductor memory chip generates an address transition detecting signal ATD for notifying a change of the CAS signal on which the data read/write operation is based.

With reference to FIG. 2, the steps of reading data stored in the memory cell 11 will now be described.

When an address signal ADD changes its level (i.e., value) as shown in FIG. 2C, the address transition detecting signal ATD turns to a low level as shown in FIG. 2D. At this time, an equalization control signal EQC shown in FIG. 2E is applied to activate each of the pair of equalizers 14A, 14B. The pair of equalizers 14A, 14B equalize the input/output lines I/O to the level of the supply voltage Vcc as shown in the leading portion of FIG. 2G during a time period t.

Next, the equalization control signal EQC turns to a low level and then a high switch signal YS is applied to the switch unit 13 to turn on each of the NMOS transistors NM12, NM13 (as shown in FIG. 2B. As a result, the bit lines B/L is coupled to the input/output lines I/O, and a main amplifier control signal MAC turns to a high level to thereby actuate the main amplifier 16 as shown in FIG. 2H.

Then, a high level signal is applied to the word line W/L and the output from the capacitor C11 is transmitted through the NMOS transistor NM11 and the bit lines B/L to the sense amplifier 12. The signal sensed by the sense amplifier 12 is sent through the switch unit 13 to the input/output lines I/O to couple the electric potential of the input/output lines I/O to the first predetermined level as shown in the trailing portion of FIG. 2G.

At this time, the main amplifier 16 amplifies to a second predetermined level and outputs the signal received from the input/output lines I/O. The output from the main amplifier 16 is latched in the latch unit 17 and appropriately processed to interface with an external device (not shown) and generate the final output data Dout as shown in FIG. 2I.

Here, during a data output operation in accordance with the CAS signal, the address transition detecting signal ATD and the CAS signal are decoded to generate the switch signal YS, which is in turn provided to the switch unit 13. The equalization control signal EQC applied to each of the equalizers 14A, 14B is generated according to the address transition detecting signal ATD after a certain delay time t (=ATD). Consequently, the output time for the data Dout is delayed.

A second related art data line equalization control circuit for the direct sensing of data is shown in FIG. 3. A signal output from the bit lines B/L is applied to the gate of each of a pair of NMOS transistors NM32, NM33, and an NMOS transistor NM34 is between a node coupled to the sources of the NMOS transistors NM32, NM33 and a ground potential Vss. The NMOS transistor NM34 is switched in accordance with the switch signal YS coupled to its gate. The rest of the operation of the second related art circuit shown in FIG. 3 is identical to the circuit as shown in FIG. 1.

The related art data input/output controlling circuit of a semiconductor memory device has at least the disadvantage that the equalization control signal is based on the address transition detecting signal during a data output operation according to a CAS signal. Thus, the equalization finishing time and accordingly the data output time is delayed by as much as the timing interval of the address transition detecting signal.

Further, the delayed switching time for the bit lines and the input/output lines results in an increased electric power consumption.

Still further, the circuit is vulnerable to glitches of an address signal, which lead to instability of the circuit in an applied system and an equalizing technique using a static Y-switch causes additional electric power consumption.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

It is another object of the present invention to provide a memory cell data line equalization control circuit for a semiconductor memory device that self-equalizes the data input/output lines to control the coupling of the bit lines and data input/output lines.

To achieve at least the above-described objects in whole or in part, there is provided a memory cell data line equalization control circuit for sensing data stored in a memory cell, outputting the sensed data through a bit line and an input/output line, and writing data through the reverse steps in an input/output mechanism of a semiconductor memory device. The memory cell data line equalization control circuit includes a feedback unit for generating a plurality of feedback signals in accordance with a signal output from a main amplifier connected to the input/output line and an equalizer for equalizing the input/output line in accordance with a first one of the feedback signals.

To achieve at least the above-described objects in whole or in part, there is provided a method for sensing data stored in a memory cell and outputting the sensed data through a bit line and an input/output line in an input/output stage of a semiconductor memory device, including generating a plurality of feedback signals based on a signal output from a main amplifier coupled to the input/output line and equalizing the input/output line based on a first feedback signal of the plurality of feedback signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
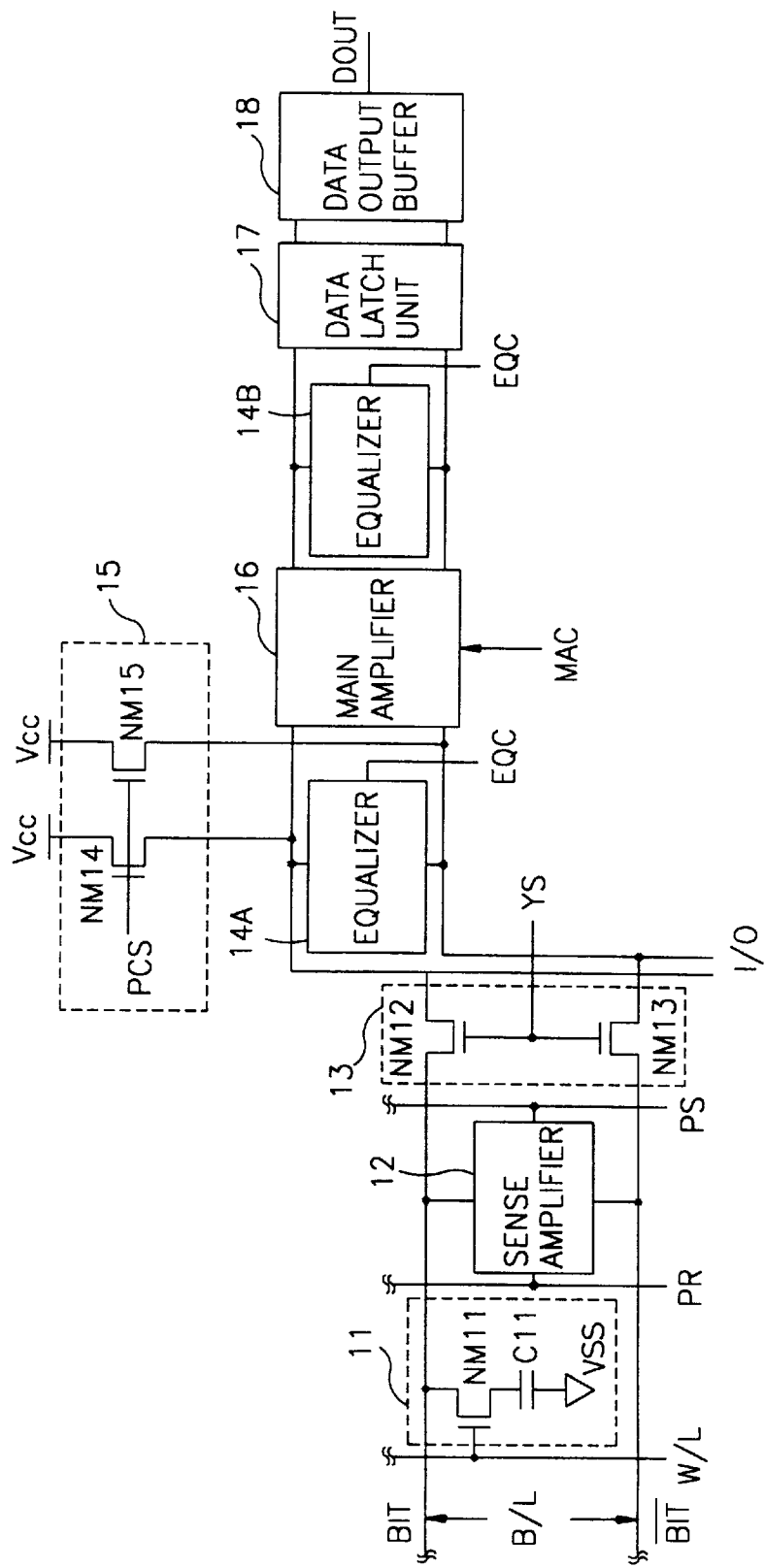
FIG. 1 is a schematic block diagram showing a related art data input/output control circuit of a semiconductor memory device.
Figure 2:
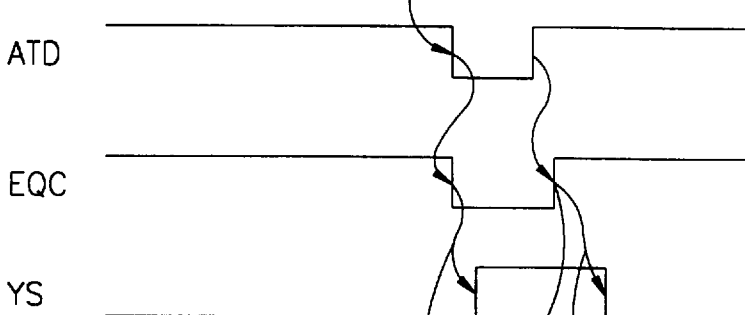
FIGS. 2A–2I are diagrams showing timing of the circuit of FIG. 1.
Figure 3:
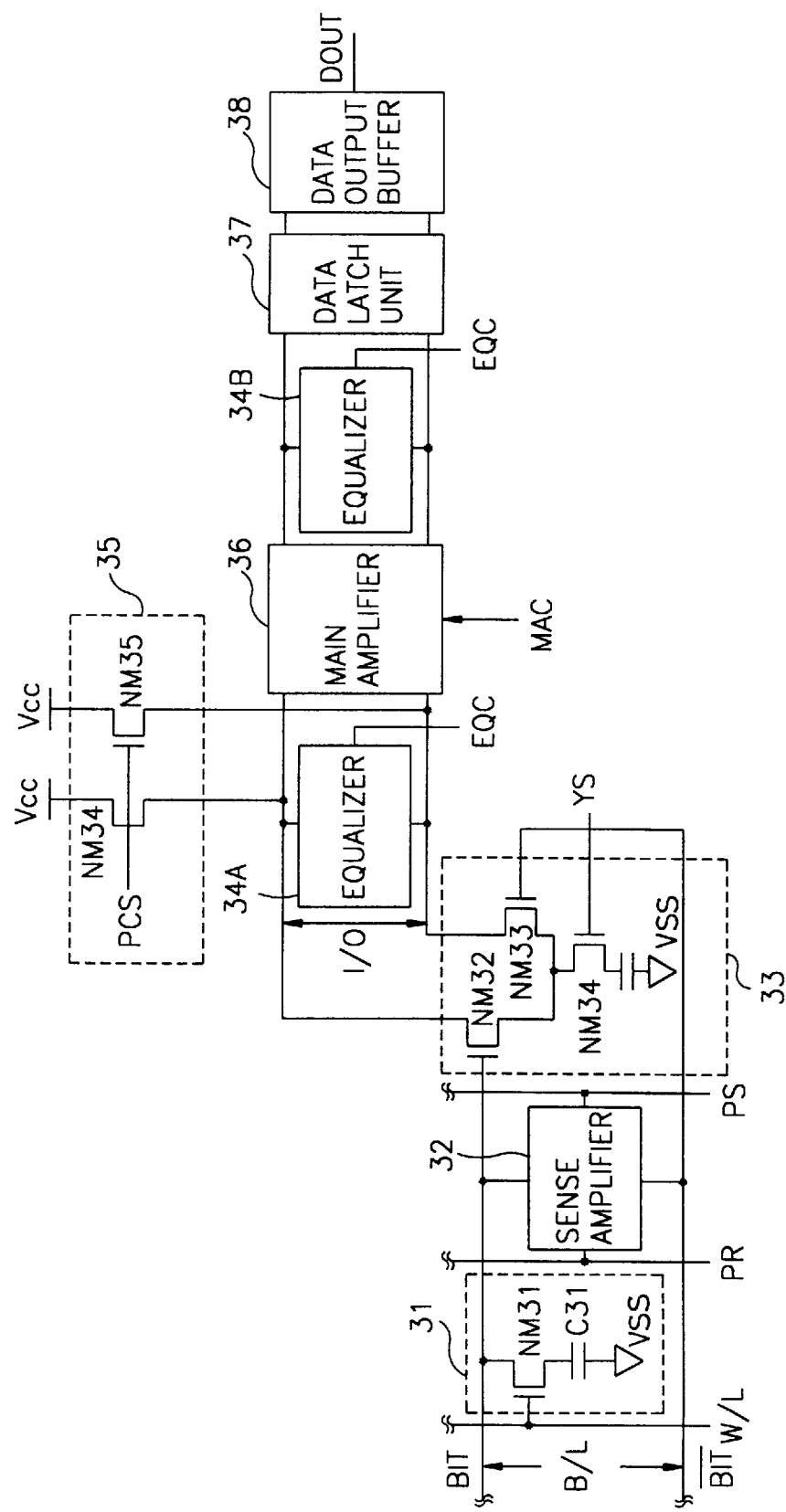
FIG. 3 is a schematic block diagram of another related art data line equalization control circuit using a direct sensing method.
Figure 4:
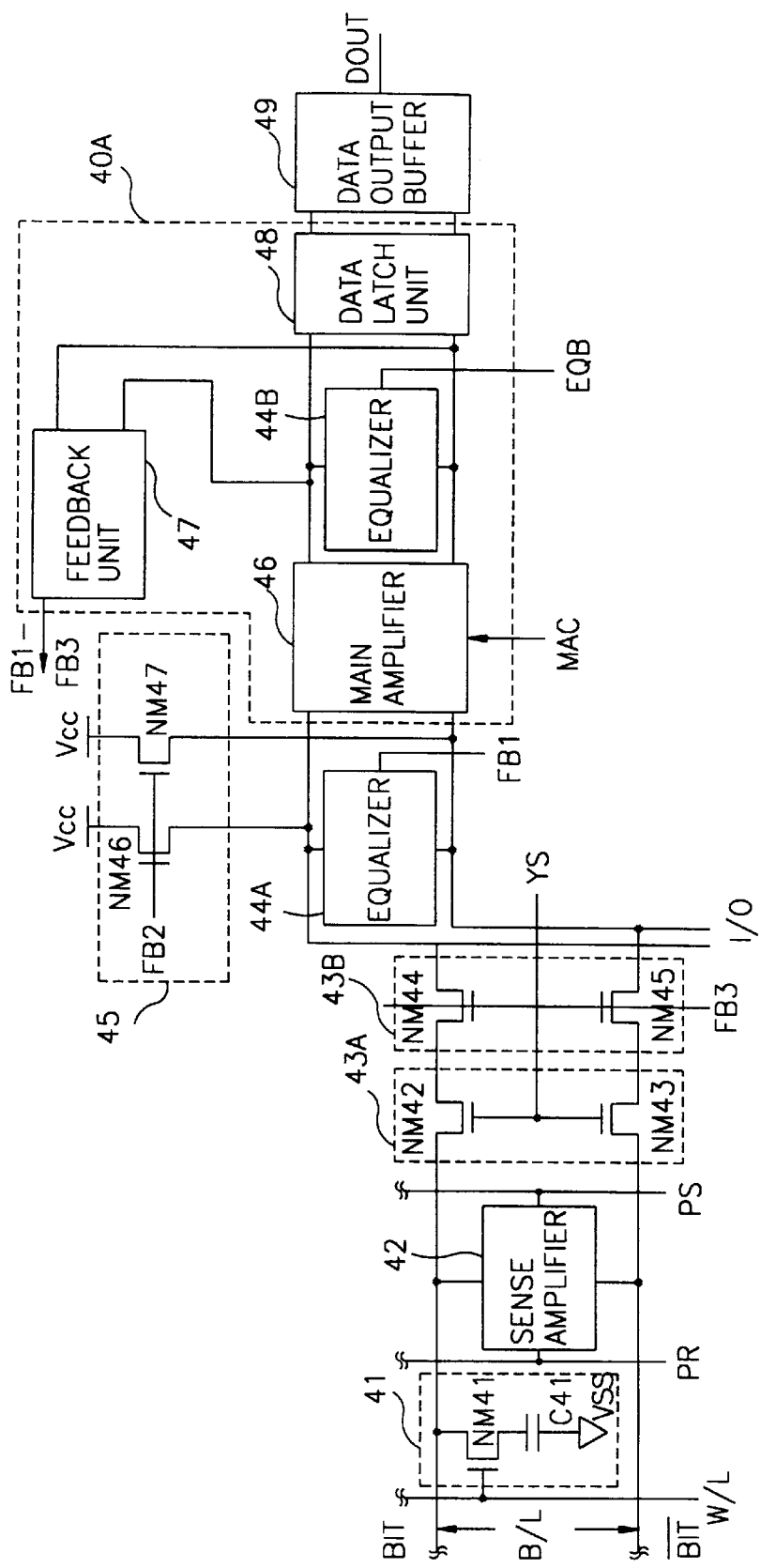
FIG. 4 is a schematic block diagram showing a preferred embodiment of a data line equalization control circuit for a semiconductor memory device according to the present invention.

As shown in FIG. 4, a data line equalization control circuit for a semiconductor memory device in accordance with a first embodiment of the present invention includes a sense amplifier 42, a first switch unit 43A, a second switch unit 43B, a precharge unit 45, a main amplifier 46, a pair of equalizers 44A, 44B, a feedback unit 47, a latch unit 48 and a data output buffer 49. The sense amplifier 42 senses and amplifies to a first predetermined level data being written to and read from a memory cell 41 via a bit lines B/L. The first switch unit 43A selectively couples the bit lines B/L to a second switch unit 43B. The second switch unit 43B selectively couples an output from the first switch 43A to an input/output lines I/O. The precharge unit 45 precharges the input/output lines I/O to the level of a supply potential Vcc in accordance with a precharge control signal that is preferably a second feedback control signal FB2.

The main amplifier 46 amplifies a signal received through the input/output lines I/O based on a main amplifier controlling signal MAC. The pair of equalizers 44A, 44B equalize the input/output lines I/O coupled thereto based on an equalization controlling signal EQB. The feedback unit 47 generates first and second feedback signals FB1, FB2 by logically combining a pair of signals a, b output from the main amplifier 46 with a write enable signal WES, and generates a third feedback signal FB3 by logically combining the signals a, b, the write enable signal WES and an address transition detecting signal ATD. The data latch unit 48 latches the output from the main amplifier 16, and the data output buffer 49 is capable of interfacing the latched data to an external device (not shown).

With reference to FIGS. 4–9, operations and effects of the data line equalization control circuit according to preferred embodiments will now be described.

First, as shown in FIG. 8A, a word line W/L is activated by a row address strobe (RAS) signal to store data in the memory cell 41 or to read stored data from the memory cell. The resulting data value is sensed in the sense amplifier 42 via the bit lines B/L. As shown in FIGS. 8A–8M, steps for reading data stored in the memory cell 41 can include the following.

As shown in FIG. 8B, a column address strobe (CAS) signal applied to a semiconductor memory chip generates a low level address transition detecting signal ATD shown in FIG. 8D for notifying of a change of the CAS signal. Then, on the basis of the low address transition detecting signal ATD, the feedback unit 47 generates each of the equalization control signal EQB as shown in FIG. 8E, a main amplifier controlling signal MAC as shown in FIG. 8I, and a feedback signal FB3 as shown in FIG. 8F.

Based on the equalization control signal EQB shown in FIG. 8E, the equalizer 44B is actuated so that the pair of signals a, b as shown in FIG. 8I from the main amplifier 46 are applied as input signals to the feedback unit 47. Then, the feedback unit 47 generates multiple feedback signals FB3, FB1 and FB2 at the respective times shown in each of FIGS. 8F, 8K and 8L. The first feedback signal FB1 enables the equalizer 44A to equalize the input/output lines I/O. Also, the second feedback signal FB2 can be used to enable the precharge unit 45 as necessary to precharge the input/output lines I/O to the level of the supply voltage Vcc.

Meanwhile, as shown in FIG. 8G, the switch signal YS enabled by the CAS signal is applied to the first switch unit 43A to turn on each of the NMOS transistors NM42, NM43 to couple the bit lines B/L through the first switch unit 43A to the input of the second switch unit 43B. Then, as described above, the change in the address transition detecting signal ATD generates the third feedback signal FB3, which is in turn applied to the second switch unit 43B to turn on the NMOS transistors NM44, NM45 to couple the bit lines B/L to the input/output lines I/O.

According to the present invention, the first switch unit 43A also can be used to obtain a similar effect as both the first and second switch units 43A, 43B by using the switch signal YS as a coding signal.

With the self-equalization of the input/output lines according to the first feedback signal FB1, the signal output from the bit lines B/L is loaded to the input/output lines I/O without a time delay t. Further, because the switch signal is generated based on the address signal, failures caused by a glitch in the address transition detecting signal ATD are prevented.

When, for example, the series of equalizing and coupling steps described above are performed, the data stored in the memory cell 41 is read based on the word line signal W/L and amplified to a certain level and sequentially transmitted through each of the first switch unit 43A, the second switch unit 43B and the input/output lines I/O to the main amplifier 46. That is, when the equalizers 44A, 44B are respectively enabled by the first feedback signal FB1 and the equalization control signal EQB so that the input/output lines I/O is self-equalized and when the first and second switch units 43A, 43B are respectively enabled by the switch signal YS and the third feedback signal FB3, the data stored in the memory cell can be transmitted to the main amplifier 46.

Figure 6:
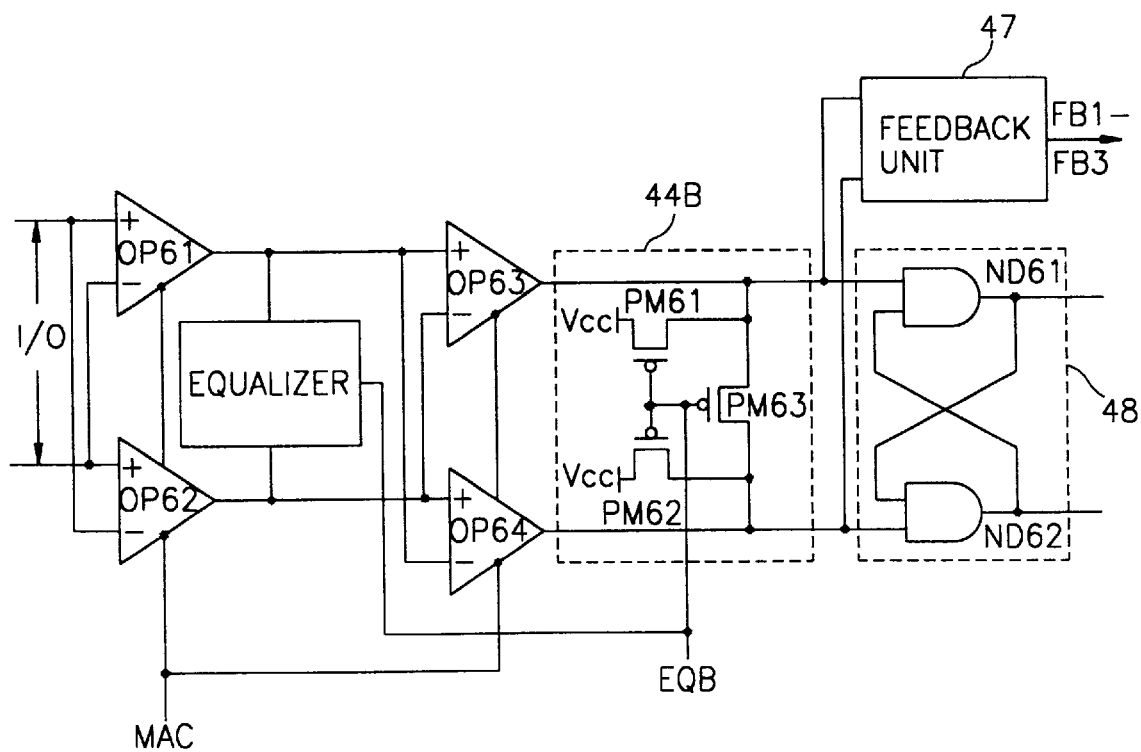
FIG. 6 is a schematic block diagram showing a main amplifier of FIG. 4.

As shown in FIG. 6, the signal applied to the main amplifier 46 is amplified first by a pair of operational amplifiers OP61, OP62, which are enabled by the main amplifier controlling signal MAC, and amplified a second time by another pair of amplifiers OP63, OP64. The signal amplified by the main amplifier 46 is then output and latched in the data latch unit 48 and finally amplified in the data output buffer 49 for a desired external transmission.

Figure 5:
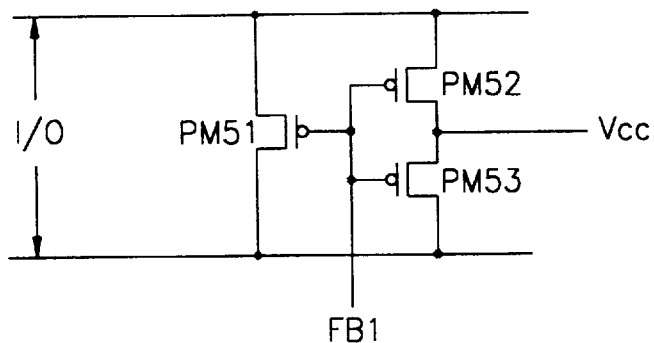
FIG. 5 is a schematic block diagram showing an equalizer of FIG. 4.

As shown in FIG. 5, the equalizer 44A receives the feedback signal FB1 at the gate of each of PMOS transistors PM51, PM52 and PM53. The PMOS transistors PM51, PM52 and PM53 are respectively turned on to equalize the input/output lines I/O.

Figure 7:
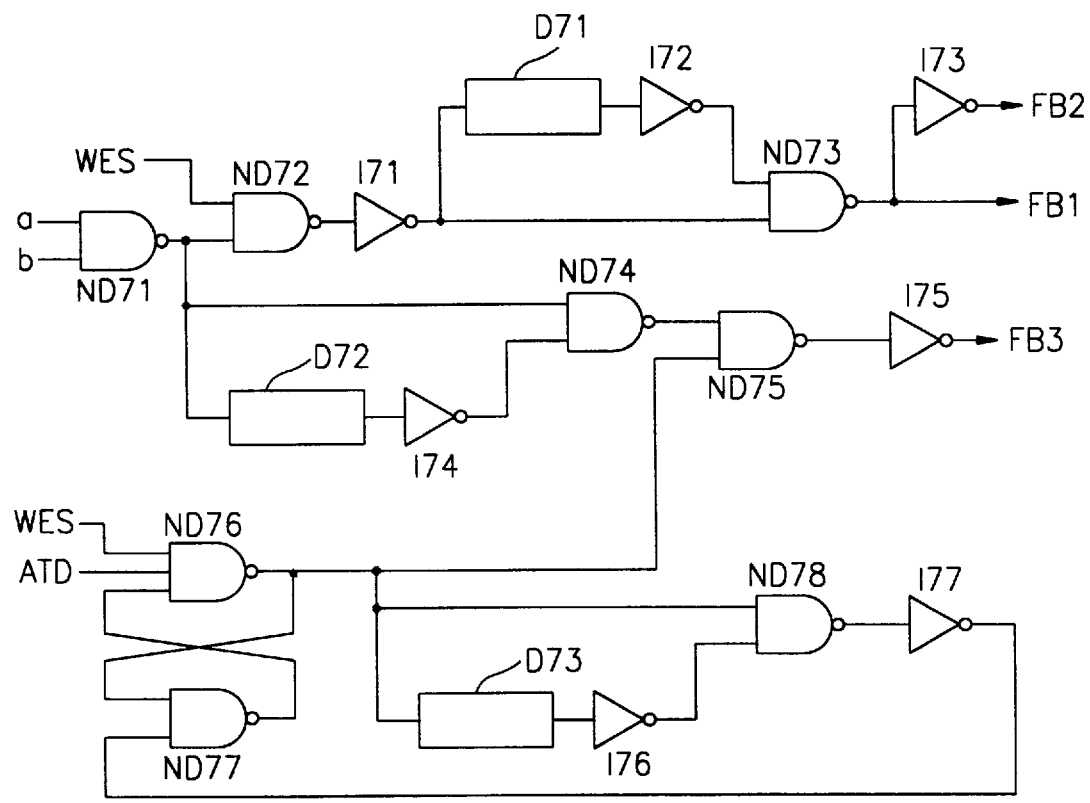
FIG. 7 is a schematic block diagram showing a feedback unit of FIG. 6.
Figure 8:
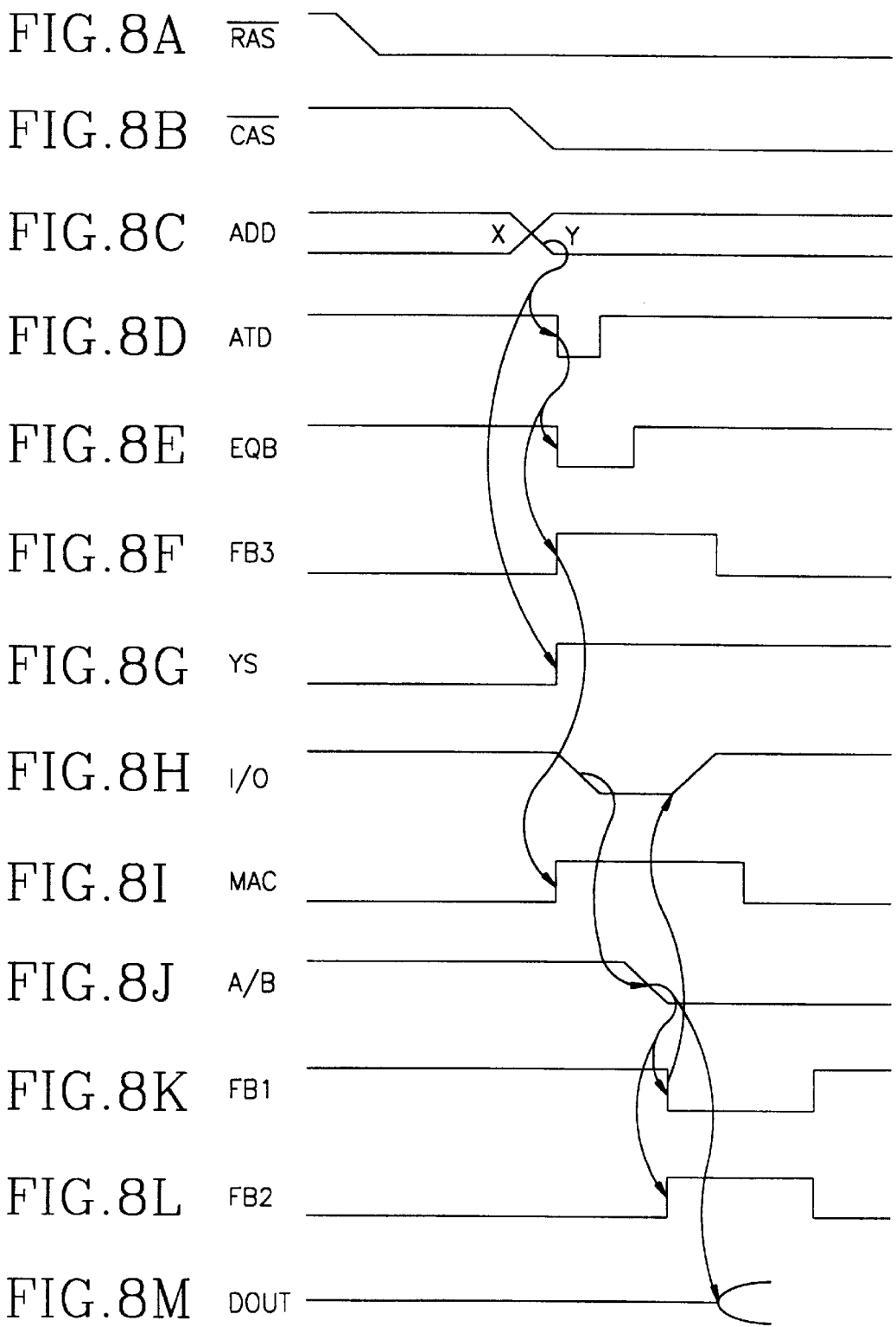
FIGS. 8A–8M are diagrams showing timing of the circuit of FIG. 4.

As shown in FIG. 7, the feedback unit 47 receives the pair of signals a, b output from the main amplifier 46. The pair of signals a, b are NANDed at a NAND gate ND71 and the output therefrom and the write enable signal WES are NANDed at a NAND gate ND72. The output from the NAND gate ND72 is inverted at an inverter I71. The output from the inverter I71 is applied to an input of a NAND gate ND73 and to a delay unit D71. The output from the delay unit D71 is inverted at an inverter I72. The resultant signals from the inverters I71, I72 are NANDed at a NAND gate ND73 to generate the first feedback signal FB1. The output of the NAND gate 73 is also inverted via an inverter I73 to generate the second feedback signal FB2.

The output from the NAND gate ND71 is also applied to an input of a NAND gate ND74 and to an input of a delay unit D72. The output from the delay unit D72 is inverted at an inverter I74. The resultant signals from the NAND gate ND71 and the inverter I74 are NANDed at a NAND gate ND74.

The write enable signal WES and the address transition detecting signal ATD are NANDed at a NAND gate ND76 with the output from a NAND gate ND77. The NAND gate ND77 NANDs the output from the NAND gate ND76, which is combined in a RS flip-flop with the NAND gate ND77, and an output from an inverter I77. The output from the NAND gate ND76 passes through a delay unit D73 and is inverted at an inverter I76. The output signal of the inverter I76 and the output signal from the NAND gate ND76 are NANDed at a NAND gate ND78 whose output is applied to the inverter I77. The resultant signals from the INAND gates ND74, ND76 are NANDed at a NAND gate ND75. The output of the NAND gate ND75 is inverted at an inverter I75 to generate the third feedback signal FB3. The delay units D71, D72 and D73 are preferably provided to expand the widths of the output pulses.

Figure 9:
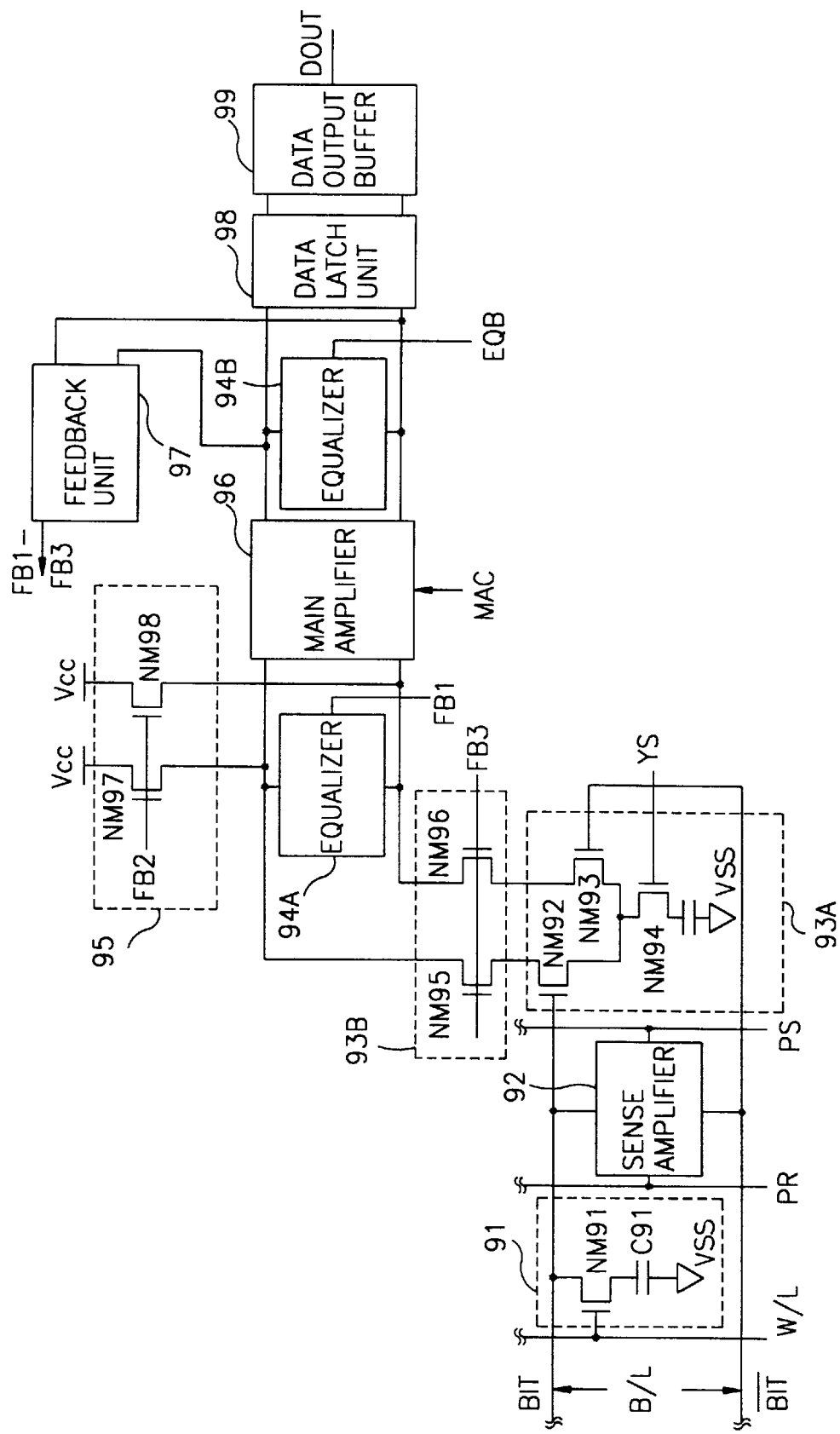
FIG. 9 is a block diagram of another preferred embodiment of a memory cell data line equalization control circuit using a direct sensing method according to the present invention.

With reference to FIG. 9, a second preferred embodiment of a data line equalization control circuit according to the present invention will be described. A second switch 93B is provided adjacent to the input/output lines I/O. The switch 93B is coupled to a first switch 93A so as to control the switching of the second switch unit 93B based on the feedback signal FB3 output from a feedback unit 97 in a similar manner as the circuit of FIG. 4. Thus, the bit lines B/L and the input/output lines are prevented from being coupled to each other for an unnecessarily additional time. As a result, electric power consumption is reduced.

As described above, the data line equalization control circuit according to the, present invention promotes the data input/output lines to be self-equalized by using feedback signals generated based on output signals from the main amplifier to control the coupling of the bit lines and the data line to increase the data input/output speed and reduce electric power consumption. Further, the present invention prevents instability of the data line equalization circuit caused by an address transition detecting signal.

It is to be understood that both the foregoing general description and the following detailed description are exemplary and explanatory. It will be apparent to those skilled in the art that various modifications can be made in the data line equalization control circuit and method of the present invention without departing from the spirit or scope of the invention. It is intended that the present invention cover the modifications and variations of this invention that are within the scope of the appended claims and their equivalents.

What is claimed is:

1. A memory cell data equalization control circuit for sensing data stored in a memory cell and outputting the sensed data through a bit line and an input/output line, wherein a main amplifier is coupled to the input/output line comprising:

a feedback unit for generating a plurality of feedback signals using at least one signal output from the main amplifier; and an equalizer for equalizing the input/output line based on a first feedback signal of the plurality of feedback signals.

2. The circuit of claim 1, further comprising a switch unit for selectively coupling the bit line to the input/output line based on a third feedback signal of the plurality of feedback signals.

3. The circuit of claim 2, further comprising a second switch unit for coupling the bit line to the switch unit based on a column address strobe signal.

4. The circuit of claim 1, further comprising a precharge unit for precharging the input/output line based on a second feedback signal of the plurality of feedback signals.

5. The circuit of claim 1, wherein in the feedback unit receives a pair of signals output from the main amplifier, the feedback unit further comprising:

a first logic gate that receives the pair of signals from the main amplifier;

a second logic gate that receives an output of the first logic gate and a write enable signal;

a third logic gate receiving an output from the second logic gate;

a fourth logic gate receiving an output from the third logic gate;

a fifth logic gate receiving an output from the fourth logic gate;

a sixth logic gate receiving an output signal from the third logic gate and the fifth logic gate to output the first one of the feedback signals.

6. The circuit of claim 5, wherein the equalizer further comprises a seventh logic gate that receives an output of the sixth logic gate to output a second one of the feedback signals.

7. The circuit of claim 5, wherein a second one of the feedback signals is the inverse of the first one of the feedback signals.

8. The circuit of claim 5, wherein in the feedback unit further comprises:
   an eighth logic gate that receives the output of the first logic gate and an inverted delayed output of the first logic gate;
   a ninth and tenth logic gates, wherein the ninth logic gate receives the write enable signal, an address transition detection signal and an output of the tenth logic gate;
   an eleventh logic gate that receives the output of the ninth logic gate and an inverted delayed output of the ninth logic gate;
   a twelfth logic gate that receives the output of the eleventh logic gate, wherein the tenth logic gate receives the output of the ninth logic gate and an output of the twelfth logic gate;
   a thirteenth logic gate that receives the output of the ninth logic gate and an output of the eighth logic gate;
   a fourteenth logic gate that receives the output of the thirteenth logic gate and generates the third feedback signal.

9. The circuit of claim 8, wherein the first, second, sixth, eighth through eleventh and the thirteenth logic gates and are NAND gates, wherein the third, fifth, seventh, twelfth and fourteenth logic gates are inverters and wherein the fourth logic gate is a delay circuit.

10. The circuit of claim 8, wherein the inverted delayed output is generated by a series coupled delay circuit and an inverter.

11. The circuit of claim 1, wherein the circuit is located in an input/output stage of a semiconductor memory device.

12. The circuit of claim 1, wherein in the feedback unit receives two signals output from the main amplifier, the feedback unit further comprising:
   a first logic circuit that receives the two signals from the main amplifier and a write enable signal to output the first feedback signal;
   a first delay unit connected to the first logic circuit;
   a second logic circuit that receives the two signals from the main amplifier, the write enable signal and an address transition detection signal to output a second feedback signal for coupling the bitline to the input/output line; and
   a second delay unit connected to the second logic circuit.

13. A memory cell data equalization control circuit receiving data for storing in a memory cell, wherein the data is received through an input/output line and transmitted to the memory cell over a bit line, wherein a main amplifier is coupled to the input/output line, comprising:
   a feedback unit that generates a plurality of feedback signals using two signals received from the main amplifier; and
   an equalizer that self-equalizes the input/output line using a first feedback signal of the plurality of feedback signals.

14. The circuit of claim 13, the feedback unit further comprising:
   first and second switch units, wherein the second switch unit selectively couples the first switch to the input/output line using a third feedback signal of the plurality of feedback signals, wherein the first switch unit selectively couples the bit line to the second switch unit using a control signal, and wherein the feedback unit comprises,
   a logic circuit that receives the two signals output by the main amplifier and a write enable signal to output the first feedback signal and a second feedback signal, and
   a delay unit connected to the logic circuit.

15. A method for sensing data stored in a memory cell and outputting the sensed data through a bit line and an input/output line in an input/output stage of a semiconductor memory device, comprising the steps of:
   generating a plurality of feedback signals based on a signal output from a main amplifier coupled to the input/output line; and
   equalizing the input/output line based on a first feedback signal of the plurality of feedback signals.

16. The method of claim 15, further comprising the step of selectively coupling the bit line to the input/output line based on a third feedback signal of the plurality of feedback signals.

17. The method of claim 15, further comprising the step of precharging the input/output line based on a second feedback signal of the plurality of feedback signals.

18. The method of claim 17, wherein the reverse steps in the input/output. stage of the semiconductor memory device writes data to the memory cell.

19. The method of claim 15, wherein in the generating a plurality of feedback signals step further comprises:
   receiving a pair of signals output from the main amplifier;
   NANDing the pair of signals from the main amplifier in a first NAND gate;
   NANDing an output of the first logic gate and a write enable signal in a second NAND gate;
   NANDing an inverted output of the first NAND gate and a delayed output of the first NAND gate in a third NAND gate to generate the first feedback signal.

20. The method of claim 19, further comprising the step of inverting the first feedback signal to generate the second feedback signal.

* * * * *